(12) United States Patent
Lin

(10) Patent No.: US 8,698,561 B2
(45) Date of Patent: Apr. 15, 2014

(54) OPERATIONAL AMPLIFIER CIRCUIT STRUCTURE

(75) Inventor: Po-Chih Lin, Taipei (TW)

(73) Assignee: Integrated Solutions Technology Inc., Taipei (TW)

( * ) Notice: Subject to any disclaimer, the term of this patent is extended or adjusted under 35 U.S.C. 154(b) by 80 days.

(21) Appl. No.: 13/441,865

(22) Filed: Apr. 7, 2012

(65) Prior Publication Data

US 2013/0076440 A1     Mar. 28, 2013

(30) Foreign Application Priority Data

Sep. 27, 2011  (TW) .............................. 100134716 A

(51) Int. Cl.
*H03F 3/45*        (2006.01)
(52) U.S. Cl.
USPC ........................................................ 330/257

(58) Field of Classification Search
USPC ................................................. 330/257, 288
See application file for complete search history.

(56) References Cited

U.S. PATENT DOCUMENTS 7,868,695 B2 *    1/2011   Ishiguro et al. ............... 330/253

* cited by examiner

*Primary Examiner* — Steven J Mottola
(74) *Attorney, Agent, or Firm* — Li & Cai Intellectual Property (USA) Office

(57) ABSTRACT

An operational amplifier circuit structure is provided. The operational amplifier circuit structure includes a first current mirror associated with a first current mirror ratio, a second current mirror coupled to the first current mirror and associated with a second current mirror ratio, an input portion coupled to the first current mirror and the second current mirror, an output portion coupled between the input portion and the first current mirror and the input portion and the second current mirror, and associated with a first output impedance and a second output impedance, respectively, and a current source coupled to the input portion.

4 Claims, 5 Drawing Sheets

OPERATIONAL AMPLIFIER CIRCUIT STRUCTURE

BACKGROUND OF THE INVENTION

1. Field of the Invention

The instant disclosure relates to an operational amplifier, and more particularly, to an operational amplifier that is capable of minimizing impact of an offset voltage by adjusting a gain thereof through manipulation of a current mirror ratio of a current mirror and a load.

2. Description of Related Art

Operational amplifiers have been widely utilized in numerous electronic components such as buffers, filters, and digital-to-analog converters.

Ideal operational amplifiers are associated with characteristics including infinite input resistance, zero output impedance, infinite open loop gain, infinite common mode rejection ratio, and indefinite bandwidth. However, due to limitations to the manufacturing process of the operational amplifiers it is almost impossible for the real-world operational amplifiers to possess the above-mentioned characteristics. And the deviation from the ideality is traditionally represented in terms of an offset voltage and the presence of the offset voltage needs additional mechanism of compensation.

For compensating the offset voltage, a traditional operational amplifier device having a unit gain operational amplifier, an offset voltage compensating unit and an equivalent voltage source is provided. The unit gain operational amplifier is associated with a gain of "1" for equaling an output voltage to an input voltage. The unit gain operational amplifier further includes an input circuitry and an output circuitry, while the equivalent power source is for representing the deviation from the ideality of the operational amplifier device and is not actually present in the operational amplifier. Specifically, an output voltage of the equivalent power source corresponds to the offset voltage of the unit gain operational amplifier, and the offset voltage compensating unit, which includes at least three switches and a capacitor, is for compensating the offset voltage taking advantage of the characteristic of the "virtual shorting" of the unit gain operational amplifier.

When traditional the operational amplifier device operates in an offset voltage storage mode, two of three switches are conducted and the remaining one switch is turned off, causing the voltage difference between a positive input terminal and an output terminal of the unit gain operational amplifier, which is the so-called offset voltage, to charge the capacitor. And when the traditional operational amplifier operates in an offset voltage compensating mode the switch that is closed when the offset voltage storage mode is entered becomes conducted, with the switches that are turned on when the offset voltage storage mode is entered being turned off. As such, the voltage difference that is stored in the capacitor over the course of the offset voltage storage mode could help minimize the impact of the offset voltage, reducing the voltage difference between the positive input terminal and the output terminal of the unit gain operational amplifier to be approaching to zero.

When the output voltage of the operational amplifier device varies along with changes in the input voltage, the offset voltage compensating unit operates to compensate the impact of the offset voltage by switching on/off the switches.

However, when the output terminal of the unit gain operational amplifier is coupled to another capacitor, changes in the output voltage in accordance with the changes in the input voltage are affected by a slew rate of the unit gain operational amplifier. Thus, the changes in the output voltage could not synchronize with the changes in the input voltage, resulting in discrepancy between the input voltage and the output voltage at least at certain points of time. Consequently, the voltage stored in the capacitor may not be equal to the offset voltage and cannot be entirely compensated when the traditional operational amplifier device operates in the offset voltage compensating mode, undermining the performance of the traditional operational amplifier device.

SUMMARY OF THE INSTANT DISCLOSURE

The primary objective of the instant disclosure is to provide an operational amplifier circuit structure that is capable of minimizing the offset voltage and providing a larger gain.

To achieve the aforementioned goal, the disclosed operational amplifier circuit structure includes a first current mirror associated with a first current mirror ratio, a second current mirror coupled to the first current mirror and associated with a second current mirror ratio, an input portion coupled to the first current mirror and the second current mirror, an output portion coupled between the input portion and the first current mirror and the input portion and the second current mirror, and associated with a first output impedance and a second output impedance, respectively, and a current source coupled to the input portion.

For minimizing an occurrence of an offset voltage, the first current mirror ratio and the second current mirror ratio may be adjusted to be substantially the same, causing the first output impedance and the second impedance to be substantially the same.

A gain of the disclosed operational amplifier circuit structure is adjustable when the first current mirror ratio or the second current mirror ratio is adjusted.

The operational amplifier circuit structure may further include a third current mirror associated with a third current mirror ratio and a fourth current mirror associated with a fourth current mirror ratio. The third current mirror is coupled to a predetermined location of the first current mirror that is on the same side along with the input portion, and the fourth current mirror is coupled to a predetermined location of the second current mirror that is on the same side along with the input portion. The third current mirror ratio may be set to be substantially the same as the fourth current mirror ratio, which is substantially equal to both the first current mirror ratio and the second current mirror ratio, while a first variable resistance is coupled between the third current mirror and the first current mirror, and a second variable resistance is coupled between the fourth current mirror and the second current mirror. The occurrence of the offset voltage may be minimized by having the first variable resistance and the second variable resistance adjusted.

Additionally, the input portion may be implemented in terms of a rail-to-rail amplifier circuit, and the output portion may be implemented in terms of a buffer of a high output through rate.

In order to further the understanding regarding the instant disclosure, the following embodiments are provided along with illustrations to facilitate the disclosure of the instant disclosure.

DETAILED DESCRIPTION OF THE EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
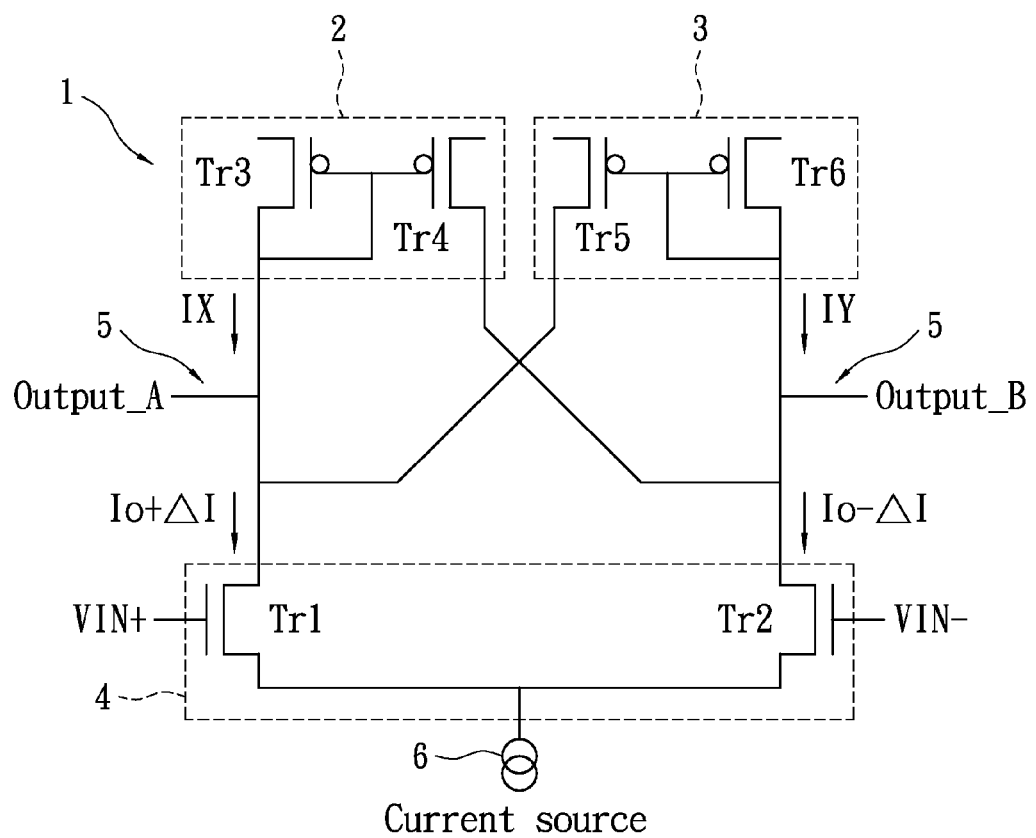
FIG. 1 illustrates an operation amplifier circuit structure according to the first embodiment of the instant disclosure.

Please refer to FIG. 1 illustrating an operation amplifier circuit structure 1 according to the first embodiment of the instant disclosure. The operation amplifier circuit structure 1 may include a first current mirror 2, a second current mirror 3, an input portion 4, an output portion 5, and a current source 6. The input portion 4 may be implemented in terms of a pair of transistors Tr1 and Tr2, while the first current mirror 2 may be formed by another pair of transistors Tr3 and Tr4 having a mirror ratio of α. Meanwhile, the second current mirror 2 may be formed by another pair of transistors Tr5 and Tr6 having a mirror ratio of β.

Sources of the transistors Tr3 and Tr5 may be coupled to a drain of the transistor Tr1, gates of the transistors Tr3 and Tr4 may be coupled to each other, and gates of the transistors Tr5 and Tr6 may be coupled to each other as well. At the same time, sources of the transistors Tr4 and Tr6 may be coupled to a drain of the transistor Tr2, and source of the transistors Tr1 and Tr2 may be coupled to the current source 6, with a gate of the transistor Tr1 serving as a positive input terminal VIN+ and a gate of the transistor Tr2 serving as negative input terminal VIN−.

When a drain current of the pair of the transistors Tr1 and Tr2 that are balanced is represented by $I_0$, with drain currents of the pair of the transistors Tr1 and Tr2 represented in terms of $I_0+\Delta I$ and $I_0-\Delta I$ when gate inputted voltages VIN+ and VIN− are different. As such, $I_X$ and $I_Y$, which are drain currents of the transistors Tr3 and Tr6, respectively, may be represented in equations in the follows:

$$I_0+\Delta I=I_X+\beta I_Y \quad (1)$$

$$I_0-\Delta I=I_Y+\alpha I_X \quad (2)$$

And from both equations (1) and (2) $I_X$ and $I_Y$ could become:

$$I_X=(I_0(1-\beta)+\Delta I(1+\beta))/(1-\alpha\beta)$$

$$I_Y=(I_0(1-\alpha)+\Delta I(1+\alpha))/(1-\alpha\beta)$$

Further, assume the first output impedance at an output terminal Output_A is Ra and since $I_0$ is so much larger than $\Delta I$ that $I_0 \pm \Delta I$ would be $I_0$, Ra could be represented as: $Ra=\sqrt{(L/(2\mu CW))}/\sqrt{(I_X)}=A/\sqrt{(I_0(1-\beta)/(1-\alpha\beta))}$ where L and W refer to size of the transistor, μ refers to the mobility of electrons, and C is the capacitance of the oxide film.

Similarly, the second output impedance Rb at another output terminal Output_B may become $Rb=A/\sqrt{(I_0(1-\alpha)/(1-\alpha\beta))}$ so long as $I_0$ is so much larger than $\Delta I$ that $I_0 \pm \Delta I$ would be $I_0$.

As such, AC output voltages Va and Vb at the output terminals Output_A and Output_B, respectively, may be derived from Ra*(AC component of $I_X$) and Rb*(AC component of $I_Y$), which may be represented as:

$$Va = Ra*(\delta IX/\delta \Delta I)*\Delta I \quad (3)$$
$$= A*\sqrt{(((1+\beta)^2)/((1-\alpha\beta)(Io*(1-\beta))))}*\Delta I$$

$$Vb = Rb*(\delta IY/\delta \Delta I)*\Delta I \quad (4)$$
$$= A*\sqrt{(((1-\alpha)^2)/((1-\alpha\beta)(Io*(1-\alpha))))}*\Delta I$$

Accordingly, the gain of the operational amplifier circuit structure 1 may be: (Va+Vb)/Vi, with Vi being equaled to $2*(A/\sqrt{(Io)})*\Delta I$. With equations (3) and (4), the gain may be rewritten as: $1/(2\sqrt{(1-\alpha\beta)})*((1+\beta)/\sqrt{(1-\beta)}+(1+\alpha)/\sqrt{(1-\alpha)})$. When α=β=K, the gain may become $1/(\sqrt{(1-K^2)})*((1+K)/\sqrt{(1-K)})=(\sqrt{(1+K)})/(1-K)$. When K=0.75, the gain of the operational amplifier circuit structure 1 may be $(\sqrt{(1+0.75)})/(1-0.75)=(\sqrt{(1.75)})/0.25=5.29$. In another implementation, when K=0.9, the gain of the same operational amplifier circuit structure 1 may become $(\sqrt{(1+0.9)}/(1-0.9)=(\sqrt{(1.9)})10.1=13.78$. Therefore, the gain of the operational amplifier circuit structure may be adjustable on basis of the ratio between the current mirror ratio of the first current mirror and the current mirror ratio of the second current mirror. When the current mirror ratios of both the first current mirror and the second current mirror remain substantially identical, loads at both drains of the transistors Tr1 and Tr2 may be substantially identical, minimizing the occurrence of the offset voltage.

Figure 2:
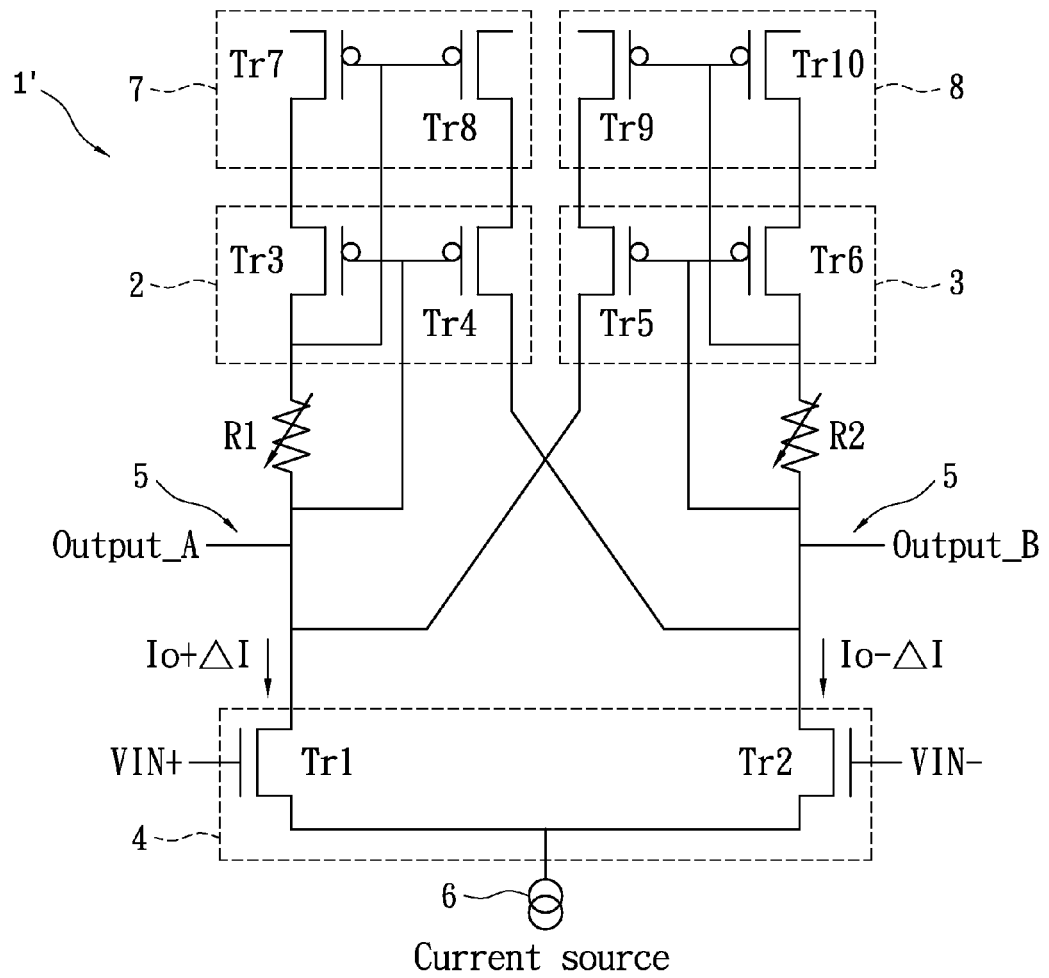
FIG. 2 illustrates a simplified circuit diagram of another operational amplifier circuit structure according to the second embodiment of the instant disclosure.

Please refer to FIG. 2 of a simplified circuit diagram of another operational amplifier circuit structure 1' according to the second embodiment of the instant disclosure. Compared with the operational amplifier circuit structure 1, the operational amplifier circuit structure 1' may further include a third current mirror 7 and a fourth current mirror 8. The third current mirror 7 may be associated with a third current mirror ratio of K, while the fourth current mirror 8 may be associated with a fourth current mirror ratio of K. As previously mentioned, in one implementation the third current mirror ratio and the fourth current mirror ratio may be the same as the current mirror ratios of the first current mirror and the second current mirror. Meanwhile, the third current mirror 7 may be coupled to the first current mirror 2 at a predetermined location that is on the same side along with the input portion 4. The fourth current mirror 8 may be coupled to the second current mirror 3 at another predetermined location that is on the same side along with the input portion 4 also. A first variable resistance R1 may be coupled between the third current mirror 7 and the first current mirror 2, while a second variable resistance may be coupled between the fourth current mirror 8 and the second current mirror 3. The occurrence of the offset voltage may be minimized or even eliminated when the resistance of the first variable resistance R1 and the second variable resistance R2 is adjusted.

The third current mirror 7 may include another pair of transistors Tr7 and Tr8 and the fourth current mirror 8 may be formed by another pair of transistors Tr9 and Tr10. Gates of the transistors Tr7 and Tr8 may be coupled to each other and to one side of the first variable resistance R1 that is not in direct connection with the input portion 4 (e.g., via the first variable resistance). Gates of the transistors Tr9 and Tr10 may be coupled to each other as well when being coupled to one side of the second variable resistance R2 that is in direction connection with the input portion 4 (e.g., not via the second variable resistance). Sources of the transistors Tr7, Tr8, Tr9, and Tr10 may be coupled to the drains of the transistors Tr3, Tr4, Tr5, and Tr6, respectively. The gates of the transistors Tr3 and Tr4 may be coupled to the other side of the first variable resistance R1, which is in direct connection with the input portion 4, while the gates of the transistors Tr5 and Tr6 may be coupled to the other side of the second variable resistance R2 that is not in direction connection with the input portion 4.

With the transistors Tr7-Tr10, the first variable resistance R1, the second variable resistance R2, the current mirrors may be in cascade connection. Consequently, the current mirror ratios of the current mirrors may not change when the current source changes in value.

Despite the offset voltage arising out of the structure of the operational amplifier circuit may be compensated, another variety of the offset voltage associated with the manufacturing process of the integrated circuit may need to be taken care of as well. For example, even the transistors Tr1 and Tr2 are intended to be identical the manufacturing of the transistors Tr1 and Tr2 may lead to difference in characteristics of the transistors Tr1 and Tr2.

In order to compensate this particular offset voltage, the resistance of the first variable resistance R1 or the second variable resistance R2 may be adjusted.

For instance, the resistance of the first variable resistance R1 may be increased to compensate the offset voltage arising out of a threshold voltage of the transistor Tr1 being less than a threshold voltage of the transistor Tr2. When the resistance of the first variable resistance R1 increases, a drain voltage (Vds) of the first transistor Tr1 may decrease in order to compensate the aforementioned offset voltage. On the other hand, when the offset voltage is caused by the threshold voltage of the transistor Tr1 being larger than the threshold voltage of the transistor Tr2 the resistance of the second variable resistance R2 may be increased to compensate the generation of that particular offset voltage.

Figure 3:
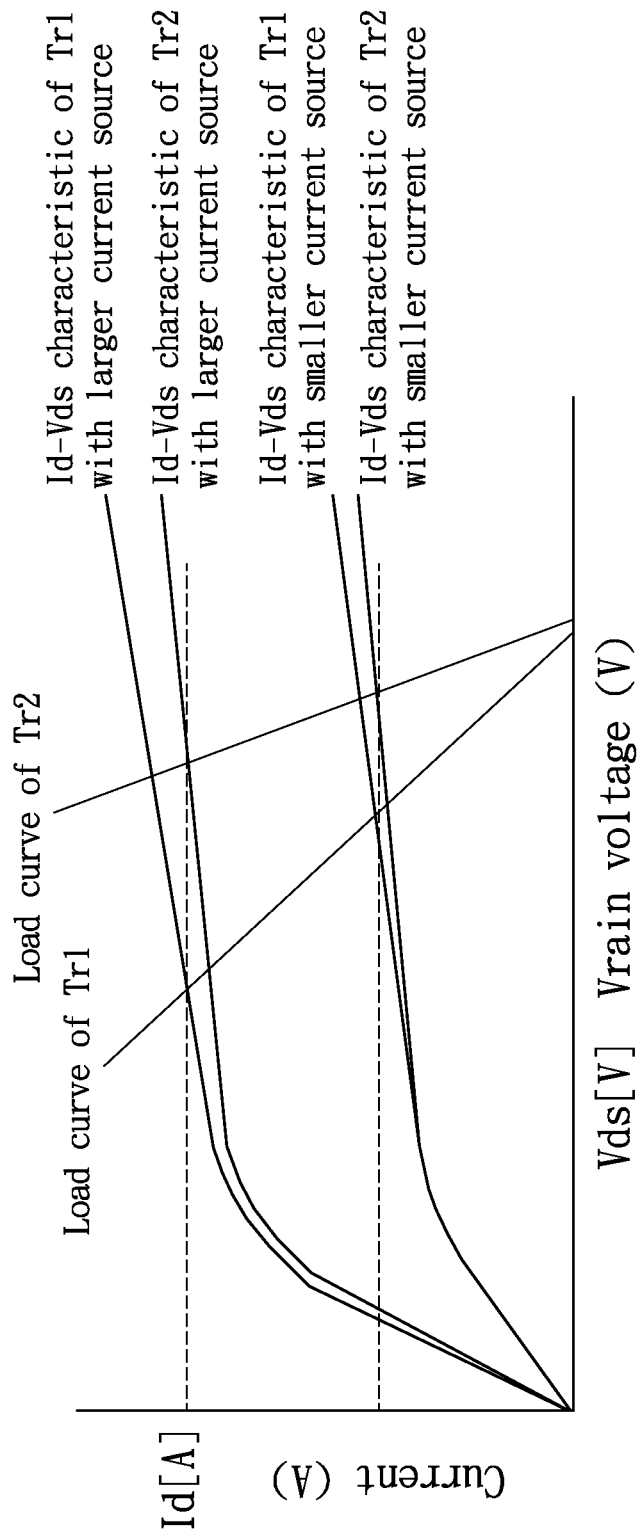
FIG. 3 illustrates a curve diagram illustrating a relationship between Vds and Id of the operational amplifier circuit structure according to the second embodiment of the instant disclosure.

Please refer to FIG. 3 showing a curve diagram illustrating a relationship between Vds and Id of the operational amplifier circuit structure according to the second embodiment of the instant disclosure.

When the operational amplifier circuit structure 1 is utilized, the compensation of the offset voltage may require no resistance coupled to the drains of the transistors Tr1 and Tr2. Plus, as shown in FIG. 3, since the drain voltage (Vds) rather than the gate voltage (Vgs) has been employed to compensate the offset voltage, coupling the resistance to the drains of the transistors Tr1 and Tr2 may become necessary so that the currents Id of the transistors Tr1 and Tr2 may be substantially identical in value, disregarding changes in the current source.

Figure 4:
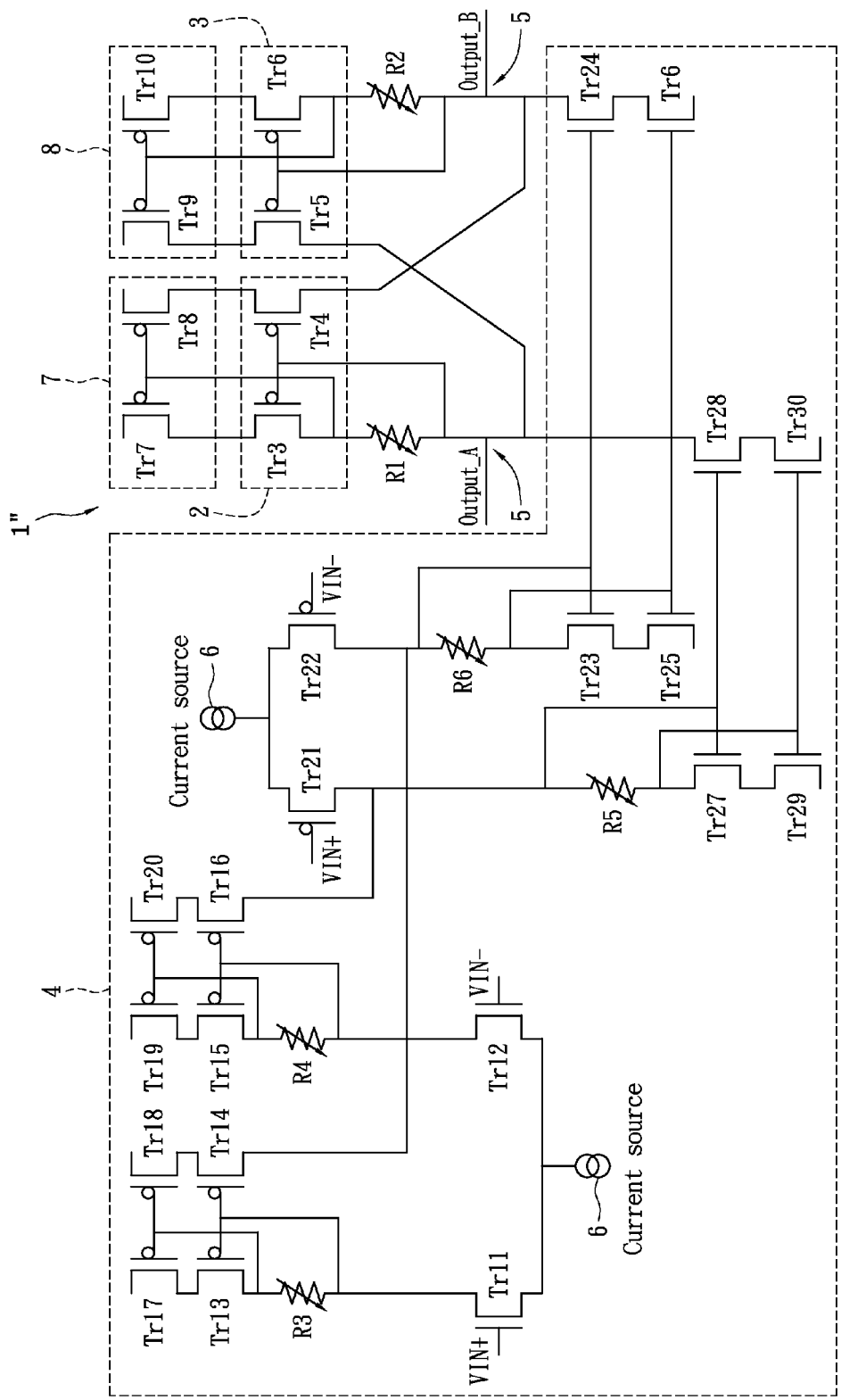
FIG. 4 illustrates a simplified circuit diagram of an operational amplifier circuit structure according to the third embodiment of the instant disclosure.

Please refer to FIG. 4 illustrating a simplified circuit diagram of an operational amplifier circuit structure 1" according to the third embodiment of the instant disclosure. As shown in FIG. 4, an input portion 4 may be implemented in terms of a rail-to-rail amplifier circuit having a PMOS and a NMOS, with transistors Tr11 to Tr30 and variable resistance R3 to R6.

The variable resistance R3 to R6 may be coupled to gates of cascade current mirrors having the transistors Tr13/Tr14, Tr15/Tr16, Tr17/Tr18, and Tr19/Tr20, respectively, for ensuring the offset voltages of the current mirrors may be compensated and broader dynamic ranges.

Figure 5:
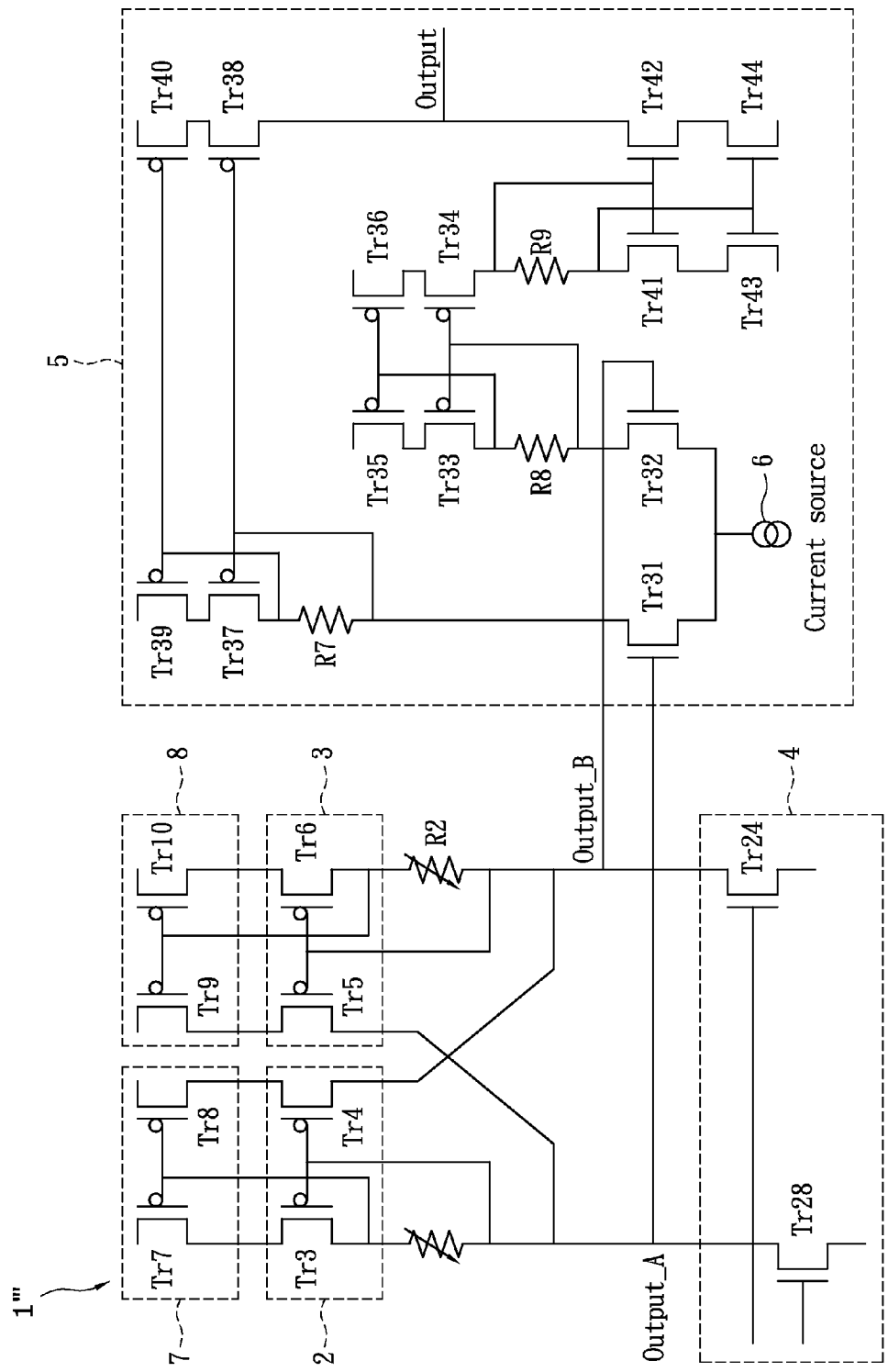
FIG. 5 illustrates a simplified circuit diagram of an operational amplifier circuit structure according to the fourth embodiment of the instant disclosure.

Please refer to FIG. 5 of a simplified circuit diagram of an operational amplifier circuit structure 1'" according to the fourth embodiment of the instant disclosure. The operational amplifier circuit structure 1'" may include an input portion 5 with a buffer circuit formed by transistors Tr31 to Tr44 and resistance R7 to R9. The connection relationship for components in the operational amplifier circuit structure 1'" may be shown in FIG. 5. Meanwhile, when the current source is configured to provide a larger current a larger output through rate may result.

The above-mentioned operational amplifier circuit structure may depend on adjusting the current mirror ratios of the current mirrors 2, 3, 7, and 8 and the resistance of variable resistance R1 and R2 to achieve the goal of compensating the offset voltages and ensuring larger gains.

The descriptions illustrated supra set forth simply the embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims

What is claimed is:

1. An operational amplifier circuit structure, comprising:
   a first current mirror, associated with a first current mirror ratio;
   a second current mirror, coupled to the first current mirror and associated with a second current mirror ratio;
   an input portion, coupled to the first current mirror and the second current mirror;
   an output portion, coupled between the input portion and the first current mirror and the input portion and the second current mirror, and associated with a first output impedance and a second output impedance, respectively;
   a current source, coupled to the input portion;
   a third current mirror associated with a third current mirror ratio, coupled to a predetermined location of the first current mirror that is on the same side along with the input portion; and
   a fourth current mirror associated with a fourth current mirror ratio, coupled to a predetermined location of the second current mirror that is on the same side along with the input portion;
   wherein, for minimizing an occurrence of an offset voltage the first current mirror ratio and the second current mirror ratio are adjusted to be substantially the same, causing the first output impedance and the second impedance to be substantially the same;
   wherein the third current mirror ratio is substantially the same as the fourth current mirror ratio, which is substantially equal to both the first current mirror ratio and the second current mirror ratio, a first variable resistance is coupled between the third current mirror and the first current mirror, a second variable resistance is coupled between the fourth current mirror and the second current mirror, and the occurrence of the offset voltage is minimized by having the first variable resistance and the second variable resistance adjusted.

2. The operational amplifier circuit structure according to claim 1, wherein a gain of the operational amplifier circuit structure is adjustable by having the first current mirror ratio or the second current mirror ratio adjusted.

3. The operational amplifier circuit structure according to claim 1, wherein the input portion is a rail-to-rail amplifier circuit.

4. The operational amplifier circuit structure according to claim 1, wherein the output portion is a buffer circuit of a high output through rate.

* * * * *